(12) United States Patent
Ito et al.

(10) Patent No.: US 7,842,397 B2
(45) Date of Patent: Nov. 30, 2010

(54) NICKEL PLATING SOLUTION AND ITS PREPARATION METHOD, NICKEL PLATING METHOD AND PRINTED WIRING BOARD COPPER FOIL

(75) Inventors: Yasuyuki Ito, Tsuchiura (JP); Katsuyuki Matsumoto, Hitachi (JP); Koji Nukaga, Tsuchiura (JP); Yasuhiro Kusano, Inashiki-gun (JP); Kenji Yokomizo, Taito-ku (JP); Shingo Watanabe, Tsuchiura (JP); Hiroyuki Ogawara, Tsuchiura (JP); Katsumi Nomura, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 1105 days.

(21) Appl. No.: 11/524,781

(22) Filed: Sep. 21, 2006

(65) Prior Publication Data
US 2007/0071999 A1    Mar. 29, 2007

(30) Foreign Application Priority Data

Sep. 27, 2005 (JP) .............................. 2005-280826
Jun. 7, 2006 (JP) .............................. 2006-159077

(51) Int. Cl.
*B32B 15/20* (2006.01)
*H05K 1/03* (2006.01)
*C25D 3/12* (2006.01)
*C25D 7/06* (2006.01)

(52) U.S. Cl. .................. 428/607; 428/675; 428/612; 428/658; 428/626; 428/632; 428/935

(58) Field of Classification Search ................ None
See application file for complete search history.

(56) References Cited

U.S. PATENT DOCUMENTS

| | | | |
|---|---|---|---|
| 7,108,923 B1 * | 9/2006 | Ito et al. ................... | 428/675 |
| 7,341,796 B2 * | 3/2008 | Hanafusa ................... | 428/674 |
| 7,344,785 B2 * | 3/2008 | Kodaira et al. ............. | 428/675 |
| 2007/0237976 A1 * | 10/2007 | Okada et al. ............... | 428/606 |

FOREIGN PATENT DOCUMENTS

| | | | |
|---|---|---|---|
| JP | 52-145769 | | 12/1977 |
| JP | 06-013749 | | 1/1994 |
| JP | 6-54829 | | 7/1994 |
| JP | 09-087888 | * | 3/1997 |
| JP | 11-200099 | | 7/1999 |
| JP | 2001-172790 | | 6/2001 |
| JP | 2005-8972 | | 1/2005 |

* cited by examiner

*Primary Examiner*—John J Zimmerman
(74) *Attorney, Agent, or Firm*—Scully, Scott, Murphy & Presser, P.C.

(57) ABSTRACT

A nickel plating solution preparation method has the steps of: dissolving in water 100 g/L or more and less than 200 g/L of nickel sulfate, and 10 g/L or more and less than 30 g/L of sodium citrate or 8 g/L or more and less than 25 g/L of citric acid, but adding no nickel chloride; and adjusting a pH of the resultant solution to 2 or more and less than 4. Another nickel plating solution preparation method has the steps of: dissolving in water 100 g/L or more and less than 200 g/L of nickel sulfate, and 10 g/L or more and less than 30 g/L of sodium citrate or 8 g/L or more and less than 25 g/L of citric acid, but adding no boric acid; and adjusting a pH of the resultant solution to 2 or more and less than 4.

3 Claims, 5 Drawing Sheets

NICKEL PLATING SOLUTION AND ITS PREPARATION METHOD, NICKEL PLATING METHOD AND PRINTED WIRING BOARD COPPER FOIL

The present application is based on Japanese patent application Nos. 2005-280826 and 2006-159077, the entire contents of which are incorporated herein by reference.

BACKGROUND OF THE INVENTION

1. Field of the Invention

The invention relates to a nickel plating solution and its preparation method, a nickel plating method and printed wiring board copper foil. In particular, the invention relates to a nickel plating solution and its preparation method, a nickel plating method and printed wiring board copper foil, taking account of reducing the load on the environment.

2. Description of the Related Art

Generally, used as a printed wiring board conductor is copper or copper alloy foil (herein referred to as simply "copper foil") to which various surface treatments are made. Particularly, in the field of flexible printed wiring boards, to fabricate a printed wiring board, the copper foil is laminated with a polyimide-based resin film, or is coated with a varnish comprising mainly polyamic acid that is a precursor of polyimide-based resin. Herein, the polyimide-based resin film or varnish or cured varnish used in this case, may be referred to as "printed wiring board (PWB) base material" or simply "base material".

The good adherence (high peeling strength) between the copper foil and PWB base material is required. To this end, the bonded side of untreated copper foil (herein, simply "original foil" or "untreated foil") that is a raw material, is often made uneven by etching or plating. This surface treatment is called "roughening".

The original foil (or untreated foil) is classified into electrolytic copper foil and rolled copper foil according to its fabrication methods, but both of them use the same roughening method. For example, as the general method, there is the method depositing (precipitating) rice-grain-shaped copper on copper foil surface by burnt plating, or the method selectively etching crystal grain boundaries using the acid.

With respect to the roughening by burnt plating, besides general copper plating (copper sulfate plating), roughening by copper-nickel alloy plating has also been developed (see for example, JP-A-52-145769).

The lamination of the flexible printed wiring board copper foil and polyimide-based resin film is performed typically by heating to the order of 300° C. This temperature condition is a high temperature range for the copper foil. Such a high temperature range tends to cause active movement (diffusion) of copper atoms in the copper foil towards the laminated polyimide-based resin film. The diffused copper atoms cause decomposition of the polyimide-based resin, and produce a fragile layer, which results in a decrease in the adhering strength between the copper foil and the polyimide-based resin film. Also, the copper atom diffusion after wiring formation may cause dielectric breakdown and a short.

To prevent these malfunctions, particularly where a high temperature (e.g., order of 150-300° C.) step is included in the manufacturing process, nickel or nickel alloy plating is applied to the roughened copper foil. This is considered to be because the nickel atoms, whose diffusion coefficient is small (whose activation energy for diffusion is high) compared with the copper atoms and whose movement in the same temperature range is therefore small, can be present as a copper atom diffusion barrier. Also, applying that plating allows enhancement of resistance to oxidative and damp discoloration from the point of view of appearance.

Generally, the nickel plating application conventionally uses a nickel plate or a nickel chip as the anode. Such nickel plating causes the anode (nickel plate) to be dissolved in the plating solution to feed nickel ions, and therefore inevitably causes shifts with time, for example in the anode shape due to the consumption, the distance between the anode and plated member, etc., which results in difficulty in long-term stable nickel plating in the same setting conditions. Also, frequent replacement of the consumed anode is needed, which therefore causes a decrease in productivity. Some plating apparatus structure may require complicated anode replacement.

To solve the above drawbacks, in recent years, plating using an insoluble anode, which is often performed in copper sulfate plating, etc., has been developed for nickel plating.

In the nickel plating using an insoluble anode, however, an organic substance added as a brightener or a surfactant tends to be decomposed by oxygen generated at the anode, which causes difficulty in long-term maintenance of solution composition.

For this reason, JP-A-11-200099 discloses that an anode is covered with an ion-exchange membrane, thereby avoiding contact between the anode and the additive (organic substance) to suppress organic substance decomposition.

Also, various plating solution compositions in the nickel plating solution has so far been developed, but most generally used is a composition called "Watt bath" comprising nickel sulfate, nickel chloride and boric acid.

The basic principle of the nickel plating solution is that in the plating solution, current is conducted between an anode and a cathode to be plated, thereby depositing (precipitating) nickel ions in the plating solution on the cathode to be plated. In this case, chloride ions in the plating solution facilitate nickel dissolution of the anode, and the nickel ions are thereby fed. In that case, to restrain variation in pH of the plating solution, boric acid is generally added as a pH buffer. As an alternative of the boric acid as the pH buffer, a nickel plating method using citric acid is also known (see for example, JP-A-2001-172790).

As a nickel alloy plating, on the other hand, nickel-cobalt alloy plating is known (see for example, JP-A-6-54829).

It is known that cobalt is added in a nickel plating solution to produce nickel-cobalt alloy plating, to enhance barrier and discoloration-resistant properties of the nickel plating solution, and therefore alkali etching property, in comparison with simple nickel plating.

Additionally, cobalt is considered to also serve as a catalyst to activate a reaction of polyimide-based resin when laminated with a polyimide-based resin film, and contribute to enhancement in the peeling strength.

Besides the nickel plating, to the PWB copper foil are applied zinc plating, chromate and silane coupling (see for example, JP-A-2005-8972), although not describing in detail herein.

In the conventional nickel plating using an insoluble anode, however, it is difficult, as mentioned above, to maintain the solution composition for a long period of time, and to apply continuously stable plating because its pH tends to be lowered by oxygen produced at the anode. Particularly, in plating the flexible PWB copper foil, the spacing between the anode and the cathode is, in many cases, made as small as possible to decrease the voltage and thereby have the economical effect (a decrease in manufacturing cost), which may actually cause a substantial local drop in pH in its plated portion. In this case, in the PWB copper foil having a very small absolute value of deposited metal (very thin plating thickness) to be controlled, even a local (overall slight) pH variation leads to a very large variation relatively (relative to intended plating thickness).

Also, above-mentioned JP-A-11-200099 is complicated in its apparatus structure in comparison with a plating method using a soluble anode, and therefore has the disadvantage from the point of view of initial cost (facility introduction cost) and running cost (operation cost including maintenance cost).

Also, the boric acid conventionally used as the pH buffer is said to have difficulty obtaining a stable nickel plating film due to its deficient pH buffering ability closely to copper foil surface using an insoluble anode. Further, the boric acid is known as a toxic substance to human body, and has in recent years been restricted from being drained. The prime task is to develop an apparatus for securely removing boric acid in drainage and a pH buffer to be substituted for the boric acid.

Although above-mentioned JP-A-2001-172790 discloses the pH buffer to be substituted for the boric acid, the plating solution composition disclosed in JP-A-2001-172790 contains a nickel chloride and therefore, where an insoluble anode is used, tends to produce chlorine gas from the anode, which would make the apparatus and work environment be in a very poor state (severe condition).

Also, above-mentioned JP-A-6-54829 discloses the nickel-cobalt alloy plating, but neither supply sources of the nickel and cobalt nor a definite precipitation (electrodeposition) ratio thereof, and there is therefore no assurance of reducing the load on the environment and achieving the desirable adherence to a PWB base material.

SUMMARY OF THE INVENTION

Accordingly, it is an object of the present invention to provide a nickel plating solution and its preparation method, and a nickel plating method, which is suitable for nickel or nickel alloy plating to be applied to printed wiring board copper foil, and capable of continuously stable plating in using an insoluble anode, and which takes account of reducing the load on the environment.

It is a further object of the present invention to provide printed wiring board copper foil with good adherence (high peeling strength) to a printed wiring board base material.

(1) According to a first aspect of the invention, a nickel plating solution preparation method comprises the steps of:

dissolving in water 100 g/L or more and less than 200 g/L of nickel sulfate, and 10 g/L or more and less than 30 g/L of sodium citrate or 8 g/L or more and less than 25 g/L of citric acid, but adding no nickel chloride; and adjusting the pH of the resultant solution to 2 or more and less than 4.

(2) According to a second aspect of the invention, a nickel plating solution preparation method comprises the steps of:

dissolving in water 100 g/L or more and less than 200 g/L of nickel sulfate, and 10 g/L or more and less than 30 g/L of sodium citrate or 8 g/L or more and less than 25 g/L of citric acid, but adding no boric acid; and adjusting the pH of the resultant solution to 2 or more and less than 4.

In the above invention (1) or (2), the following modifications and changes can be made.

(i) The nickel plating solution preparation method further comprises the step of:

dissolving 13 g/L or more and less than 71 g/L of cobalt sulfate.

(ii) The nickel plating solution preparation method further comprises the step of:

dissolving a cobalt compound such as cobalt, cobalt sulfate or the like such that the resultant solution satisfies $0.11 \leq$ [cobalt (mass)/(nickel+cobalt) (mass)]$\leq 0.25$.

(3) According to a third aspect of the invention, a nickel plating solution comprises:

water, 100 g/L or more and less than 200 g/L of nickel sulfate, and 10 g/L or more and less than 30 g/L of sodium citrate or 8 g/L or more and less than 25 g/L of citric acid dissolved in the water, but no nickel chloride and boric acid added therein, wherein the pH of the solution is adjusted to 2 or more and less than 4.

(4) According to a fourth aspect of the invention, a nickel plating method comprises:

using an insoluble anode and a nickel plating solution comprising water, 100 g/L or more and less than 200 g/L of nickel sulfate, and 10 g/L or more and less than 30 g/L of sodium citrate or 8 g/L or more and less than 25 g/L of citric acid dissolved in the water, but no nickel chloride and boric acid added therein, wherein the pH of the solution is adjusted to 2 or more and less than 4.

(5) According to a fifth aspect of the invention, a printed wiring board copper foil comprises:

a nickel plating layer applied thereto with a nickel plating method comprising using an insoluble anode and a nickel plating solution comprising water, 100 g/L or more and less than 200 g/L of nickel sulfate, and 10 g/L or more and less than 30 g/L of sodium citrate or 8 g/L or more and less than 25 g/L of citric acid dissolved in the water, but no nickel chloride and boric acid added therein, wherein the pH of the solution is adjusted to 2 or more and less than 4.

In the above invention (5), the following modifications and changes can be made.

(iii) The nickel plating layer comprises a nickel-cobalt alloy plating layer;

the total deposition amount of nickel and cobalt on a side to be bonded to a printed wiring board base material is 5 $\mu g/cm^2$ or more to 20 $\mu g/cm^2$ or less; and the cobalt concentration is 60 mass % or more to 80 mass % or less.

(iv) The nickel plating layer comprises a nickel-cobalt alloy plating layer;

the total deposition amount of nickel and cobalt on a side to be bonded to a printed wiring board base material is 5 $\mu g/cm^2$ or more to 20 $\mu g/cm^2$ or less; and the cobalt concentration is 55 mass % or more to 65 mass % or less.

(v) The printed wiring board copper foil comprises a rolled copper foil used as an original foil.

<Advantages of the Invention>

According to the present invention, it is possible to provide a nickel plating solution and its preparation method, and a nickel plating method, which is suitable for nickel or nickel alloy plating to be applied to printed wiring board copper foil, and capable of continuously stable plating in using an insoluble anode, and which takes account of reducing the load on the environment, and to provide printed wiring board copper foil with good adherence to a printed wiring board base material.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Construction of Printed Wiring Board Copper Foil

Figure 1:
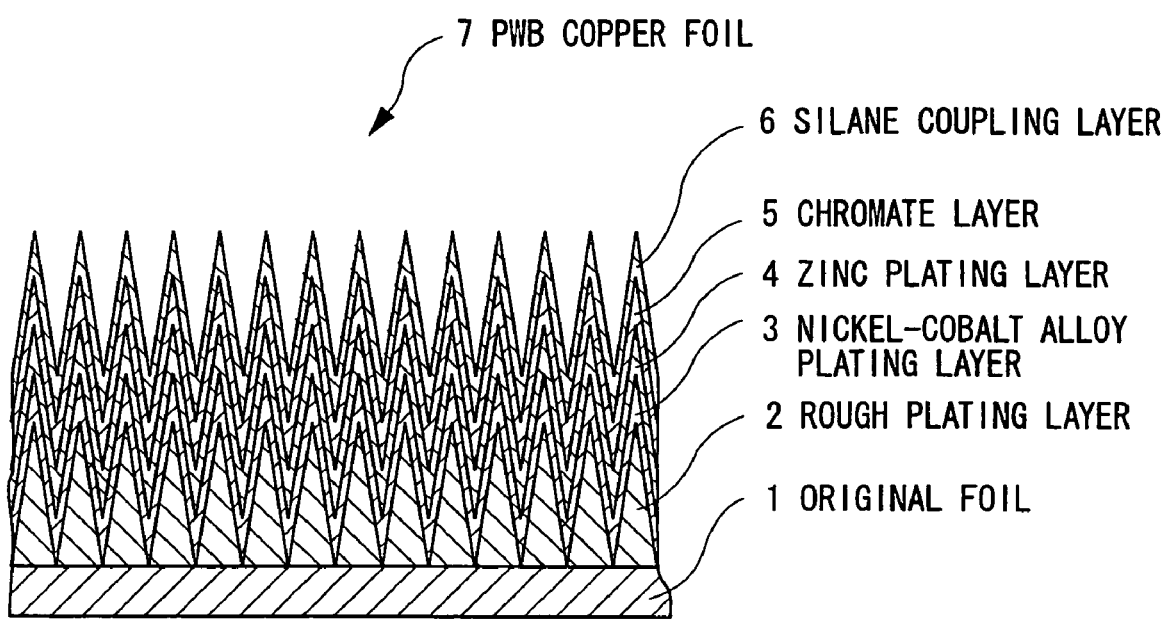
FIG. 1 is an explanatory cross-sectional view showing structure of a printed wiring board copper foil in a preferred embodiment according to the present invention.

FIG. 1 is an explanatory cross-sectional view showing structure of a printed wiring board (PWB) copper foil in a preferred embodiment according to the present invention.

Copper foil 7 comprises a rough plating layer 2 formed on a side of original foil (untreated foil) 1 to be bonded to a PWB base material, followed by stacking thereon a nickel-cobalt alloy plating layer 3, a zinc plating layer 4, a chromate layer 5, and a silane coupling layer 6. Although not shown, on the backside of the original foil 1 not to be bonded to the base material (or on the unrough surface with no copper roughening plating applied), in order to have the rust (corrosion, oxidation) resistant effect, it is desirable to form a nickel-cobalt alloy plating layer 3, a zinc plating layer 4, and a chromate layer 5.

The original foil 1 may use either electrolytic or rolled copper foil. In using copper foil for PWBs, it is preferable to use rolled copper foil for the reasons of excellent surface flatness and bending property.

Roughening Treatment

In this embodiment, for the purpose of enhancement of adhesion of the original foil 1 to the base material, the original foil 1 may be roughened. Roughening the original foil 1 is generally performed as selective etching of crystal grain boundaries in the copper foil or burnt plating of copper or copper alloy. The roughening method by the burnt plating is disclosed in JP-A-2005-8972, for example.

Also, in plating roughening, an additive of a metal element besides copper may be added. For example, there is a surface roughening method for PWB copper foil, which uses a copper sulfate-and sulfuric acid-based copper plating bath to which are added at least one metal selected from iron, nickel, cobalt, molybdenum, tungsten, titanium, and aluminum, and an organic compound such as gelatin, etc., and which performs electrolysis at current whose current density exceeds a limit current density, to form a dendritic copper electrodeposition layer on the side of copper foil to be bonded, and which performs electrolysis at current whose current density is less than the limit current density, to change the dendritic copper electrodeposition layer on the copper foil into a protuberant copper electrodeposition layer. The suitable conditions of such a method are that the amount of at least one additive of iron, nickel, and cobalt is 1-10 g/L, the amount of at least one additive of molybdenum and tungsten is 0.1-1 g/L, the amount of at least one additive of titanium and aluminum is 0.01-5 g/L, and the concentration of gelatin added is 0.1-1000 ppm.

The formation conditions of the dendritic copper electrodeposition layer are to use a plating bath added with 28 g/L of copper sulfate (e.g., copper (II) sulfate pentahydrate: $CuSO_4 \cdot 5H_2O$, product No. 83435-1201, made by JUNSEI CHEMICAL Co. Ltd.), 125 g/L of sulfuric acid (e.g., sulfuric acid: $H_2SO_4$, product No. 83010-0330, made by JUNSEI CHEMICAL Co. Ltd.), 4 g/L of iron sulfate (e.g., iron (II) sulfate heptahydrate: $FeSO_4 \cdot 7H_2O$, product No. 83380-1201 made by JUNSEI CHEMICAL Co. Ltd.), 0.3 g/L of sodium molybdate (e.g., disodium molybdate (VI) dihydrate: $Na_2MoO_4 \cdot 2H_2O$, product No. 77080-1201 made by JUNSEI CHEMICAL Co. Ltd.), and 0.3 ppm of sodium tungstate (e.g., sodium tungstate dihydrate: $Na_2WO_4 \cdot 2H_2O$, product No. 43210-1201 made by JUNSEI CHEMICAL Co. Ltd.); 40° C. of solution temperature; 40-50 $A/dm^2$ of current density; and 3-5 sec of treatment time. After the above-mentioned roughening, in order to control uneven surface (prevent variation of uneven surface or loss of protrusions), further copper plating may be applied uniformly along the roughened shape.

Also, in using rolled copper foil, prior to the above-mentioned roughening, the irregularities of the rolled copper foil surface may be removed by applying copper plating in order to smooth the surface. It is preferred that the thickness of the copper plating is 1 μm or more and less than 5 μm.

The preferred conditions (solution composition and current density) of the electrolysis in the copper plating bath are that 120-200 g/L of copper sulfate (e.g., copper (II) sulfate pentahydrate: $CuSO_4 \cdot 5H_2O$, product No. 83435-1201, made by JUNSEI CHEMICAL Co. Ltd.), 70-150 g/L of sulfuric acid (e.g., sulfuric acid: $H_2SO_4$, product No. 83010-0330, made by JUNSEI CHEMICAL Co. Ltd.), and 30-150 ppm of gelatin (e.g., gelatin, product No. 077-03155, made by Wako Pure Chemical Industries, Ltd.), and 1-5 $A/dm^2$ of current density.

Nickel Plating

Nickel plating (including nickel alloy plating) is applied to the original foil 1 thus roughened.

Figure 2:
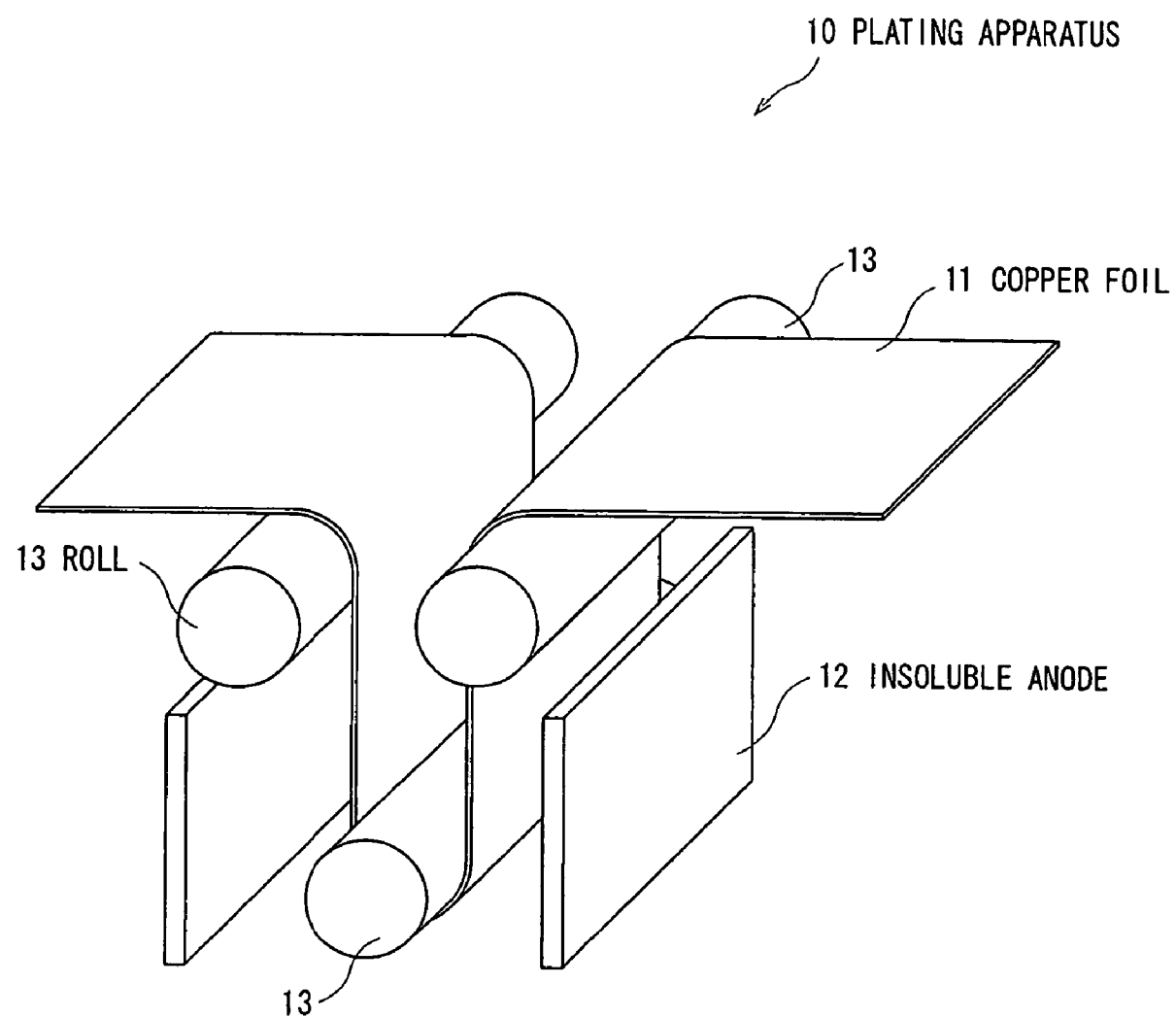
FIG. 2 is a schematic perspective view showing a plating apparatus used in a nickel plating method in a preferred embodiment according to the present invention.

FIG. 2 is a schematic perspective view showing a plating apparatus 10 used in a nickel plating method in this embodiment.

The plating apparatus 10 comprises copper foil 11 (e.g., the above original foil 1 roughened) as a cathode to be plated, an insoluble anode plate 12, and plural rolls for conveying the copper foil 11.

The insoluble anode plate 12 may use titanium, titanium alloy, platinum, platinum alloy, titanium plated with platinum, or titanium with iridium oxide deposited thereon.

The good conditions of the nickel plating in this embodiment are to use a plating solution (plating bath) added with 100 g/L or more and less than 200 g/L of nickel sulfate (e.g., nickel (II) sulfate hexahydrate: $NiSO_4 \cdot 6H_2O$, product No. 148-01175, made by Wako Pure Chemical Industries, Ltd.), and 10 g/L or more and less than 30 g/L of sodium citrate (e.g., trisodium citrate dihydrate: $Na_3(C_6H_5O_7) \cdot 2H_2O$, product No. 26075-1201 made by JUNSEI CHEMICAL Co. Ltd.) or 8 g/L or more and less than 25 g/L of citric acid (e.g., citric acid monohydrate: $C_6H_8O_7 \cdot H_2O$, product No. 26040-1201 made by JUNSEI CHEMICAL Co. Ltd.); 20-50° C. of solution temperature; 1-3 $A/dm^2$ of current density; and 2-5 sec of treatment time. In this case, no nickel chloride is used. The plating solution is used preferably in the above plating apparatus using the insoluble anode plate 12, but may also be used in a plating apparatus using a conventional anode (a nickel plate).

The nickel sulfate concentration is preferably 100 g/L or more and less than 200 g/L as the chemical feed concentration. Because of very high solution resistance for less than 100 g/L, voltage is required to be increased according thereto. For 200 g/L or more, on the other hand, the amount of the chemical used (the amount of the excess chemical that does not contribute to the plating) increases. Both are noneconomical.

Used as a pH buffer is not boric acid, but a sodium citrate or citric acid from the point of view of high pH buffering property and of cost. The sodium citrate concentration is optimally 10 g/L or more and less than 30 g/L as the chemical feed concentration. For less than 10 g/L, no necessary pH buffering is exhibited, while for 30 g/L or more, the nickel plating film thickness decreases because of a current efficiency decline caused by citric acid complex formation. For the reason similar to the above, the citric acid concentration is optimally 8 g/L or more and less than 25 g/L as the chemical feed concentration.

Because the concentrations in this invention are defined as the chemical feed concentration, calculating anhydride concentrations thereof yields 59 g/L or more and less than 118 g/L of nickel sulfate, 8.8 g/L or more and less than 26 g/L of sodium citrate, and 7.3 g/L or more and less than 23 g/L of citric acid. Anhydride concentrations of the other substances may likewise be calculated.

Also, pH is preferably 2 or more and less than 4, more preferably, 3.0 or more and less than 3.8. For less than pH 2, the irregularities of copper plating deposited on the copper foil surface by roughening prior to nickel plating can be re-dissolved in the nickel plating solution. While, for pH 4 or more, pH buffering of the sodium citrate or citric acid is weak, and there tends to be a large pH variation.

In pH adjustment, to raise pH, a nickel carbonate (e.g., basic nickel carbonate: $NiCO_3.2Ni(OH)_2.4H_2O$, product No. 144-01035, made by Wako Pure Chemical Industries, Ltd.) or a nickel hydroxide (e.g., nickel hydroxide: $Ni(OH)_2$, product No. 148-05575, made by Wako Pure Chemical Industries, Ltd.) is fed and, to lower pH, sulfuric acid is fed. Both the cases require strict pH control of the plating solution, and it is therefore desirable that its preparation apparatus has a pH automatic adjustment mechanism.

In copper foil surface treatment for PWB applications, use of nickel-cobalt alloy plating makes it possible to enhance barrier property of the copper atom diffusion and resistance property of the oxidative discoloration, and therefore adhesion to polyimide-based resin.

The nickel-cobalt alloy plating conditions in this embodiment are that cobalt (as cobalt sulfate) is added to the above nickel plating solution: specifically, using a plating solution (plating bath) added with, as the chemical feed concentration, 100 g/L or more and less than 200 g/L of nickel sulfate (e.g., nickel (II) sulfate hexahydrate: $NiSO_4.6H_2O$, product No. 148-01175, made by Wako Pure Chemical Industries, Ltd.), 13 g/L or more and less than 71 g/L of cobalt sulfate (e.g., cobalt (II) sulfate heptahydrate: $CoSO_4.7H_2O$, product No. 83240-0401 made by JUNSEI CHEMICAL Co. Ltd.), and 10 g/L or more and less than 30 g/L of sodium citrate (e.g., trisodium citrate dihydrate: $Na_3(C_6H_5O_7).2H_2O$, product No. 26075-1201 made by JUNSEI CHEMICAL Co. Ltd.) or 8 g/L or more and less than 25 g/L of citric acid (e.g., citric acid monohydrate: $C_6H_8O_7.H_2O$, product No. 26040-1201 made by JUNSEI CHEMICAL Co. Ltd.). In this case, no nickel chloride is used. It is preferred that the solution temperature is 20-50° C., the current density is 1-5 $A/dm^2$; and the treatment time is 2-5 sec.

In this nickel plating, it is very important to maintain the composition of the plating solution within an appropriate range.

Particularly, in the case of the nickel-cobalt alloy plating, the optimal film thickness of the plating and the optimal metallic concentration in the film relative to the PWB copper foil vary according to manufacturing process and use environment of the PWB using the PWB copper foil. Schematically, the PWB manufacturing process comprises the steps of "laminating fabricated PWB copper foil and a substrate to form CCL (copper clad laminate)", "forming circuit wiring in the CCL", "surface-treating on the circuit", etc.

For example, in the PWB manufacturing process (especially, the steps of forming circuit wiring, subsequent half-etching and tin plating, etc.), to reduce cobalt dissolution from the nickel-cobalt alloy plating layer, in other words "erosion phenomenon", in the case of narrow circuit wire width, it is desirable that the total deposition amount of nickel and cobalt be 5 $\mu g/cm^2$ or more to 20 $\mu g/cm^2$ or less, and that the cobalt concentration in the film be 55 mass % or more to less than 65 mass % or less, preferably 60 mass % or more to 65 mass % or less. Less than 55 mass % cobalt concentration causes a substantial reduction in adherence (peeling strength). Also, higher than 65 mass % cobalt concentration may cause cobalt to be dissolved and "eroded" by acid (e.g., oxidative acid such as sulfuric acid, nitric acid, hydrochloric acid, tin plating solution, or hydrogen peroxide, etc.), used in the above-mentioned manufacturing process.

To achieve the above-mentioned requirements of reducing the "permeation" phenomenon, it is desirable that the cobalt concentration added to the plating solution be adjusted to satisfy 0.11≦[cobalt (mass)/(nickel+cobalt) (mass)]≦0.20, preferably 0.11≦[cobalt (mass)/(nickel+cobalt) (mass)]≦0.18. Less than 0.11 causes a small amount of adhering cobalt (tends to make the cobalt concentration in the film less than 55 mass %), thus leading to a substantial reduction in the peeling strength. Also, higher than 0.20 tends to make the cobalt concentration in the film higher than 65 mass %, which may cause the "erosion phenomenon" due to acid used in the manufacturing process.

In the case of the less affect of the above-mentioned "permeation" phenomenon in the PWB manufacturing process, i.e., in the case of wide (mm order) circuit wire width, on the other hand, to raise the peeling strength between the PWB base material and the copper foil in the use environment of the PWB, it is desirable that the total deposition amount of nickel and cobalt be 5 $\mu g/cm^2$ or more to 20 $\mu g/cm^2$ or less, and that the cobalt concentration in the film be 60 mass % or more to 80 mass % or less, preferably 65 mass % or more to 75 mass % or less, more preferably 70 mass % or more to 75 mass % or less. Less than 60 mass % cobalt concentration causes difficulty obtaining peeling strength required. Conversely, even adding higher than 80 mass % cobalt concentration does not vary the peeling strength between the PWB base material and the copper foil so much, which results in a disadvantage in cost because the cobalt is very expensive compared to the nickel.

To achieve the above-mentioned requirement of higher peeling strength, it is desirable that the cobalt concentration added to the plating solution be adjusted to satisfy 0.15≦[cobalt (mass)/(nickel+cobalt) (mass)]≦0.25, preferably 0.15≦[cobalt (mass)/(nickel+cobalt) (mass)]≦0.22. Less than 0.15 causes a small amount of depositting cobalt, i.e., no effect of the peeling strength of the nickel-cobalt alloy plating. Also, even adding more than 0.25 does not vary the adherence between the polyimide-based resin and the nickel-cobalt alloy plating applied copper foil so much, which results in a disadvantage in cost because the cobalt is very expensive compared to the nickel.

The deposition amount of the nickel plating is approximately 5.7-22.7 nm in average film thickness. This film thickness is very small compared to versatile nickel plating. Nickel plating is generally applied beneath noble metal plating such as gold, silver, etc. in many cases, for jewelry or to ensure corrosion resistance. In this case, the plating thickness varies more or less according to use applications, but is generally on the order of μm. That is, in the nickel (nickel-cobalt alloy) plating amount relative to the PWB copper foil, the number of metal ions in the plating solution consumed per unit time is negligibly small. Thus, the replenishment of metal ions into the plating solution may be performed by periodically feeding a solution in which are dissolved the nickel sulfate, cobalt sulfate and sodium citrate (or citric acid) of each constant concentration.

Zinc Plating

Generally, the copper foil with the nickel plating applied thereto with the above method, is applied zinc plating as a rust-resistant layer. A zinc plating solution in applying the zinc plating may use any composition and treatment conditions of a sulfuric acid bath, alkali zincate bath, chloride bath, etc.

Next, there is shown one example of treatment conditions for the zinc plating: 20 g/L of zinc sulfate (e.g., zinc (II) sulfate heptahydrate: $ZnSO_4 \cdot 7H_2O$, product No. 83060-1201 made by JUNSEI CHEMICAL Co. Ltd.); solution temperature of 17-22° C.; pH of 2.8-3.0; current density of 0.3-1.5 $A/dm^2$; and treatment time of 2-5 sec.

In the application of the zinc plating as a rust-resistant layer for PWB copper foil, it is preferable that its deposited metal amount is 0.5 $\mu g/cm^2$ or more to 3 $\mu g/cm^2$ or less. Less than 0.5 $\mu g/cm^2$ does not serve as the rust-resistant layer, and causes difficulty controlling chromium deposition amount, as explained next. On the other hand, more than 3 $\mu g/cm^2$ zinc deposition amount tends to cause zinc exposed on the circuit side when bonded to a PWB base material to make the circuit as the PWB by etching, to be dissolved by hydrochloric acid or electroless tin plating solution during the PWB manufacturing process, thus reducing contact area with the PWB base material, and therefore decreasing the peeling strength.

Chromate Treatment

Chemical conversion called "chromate treatment" is performed to the zinc plating layer. In this case, taking account of the effect on surrounding environment and human body, solution composition without containing detrimental hexavalent chromium in the chemical conversion solution should be used. For example, a trivalent chromium conversion method using trivalent chromium is used.

As a trivalent chromium conversion solution used in the trivalent chromium conversion, there is used a solution, which does substantially not contain detrimental hexavalent chromium, but which contains trivalent chromium ions (as metal chromium) of 70 mg/L or more and less than 500 mg/L, preferably 110 mg/L or more to 400 mg/L or less, more preferably 150 mg/L or more to 300 mg/L or less, and whose pH is 3.0-4.5, preferably 3.5-4.0, more preferably 3.6-3.8. The pH>4.5 tends to cause degradation in chromium ion stability (solubility) in the plating solution, and therefore precipitation and settlement in the form of a hydroxide, or the like, thus resulting in difficulty controlling chromium film formation. Setting the trivalent chromium ion concentration in the trivalent chromium conversion solution at the order of 70-500 mg/L, and the pH as high as possible within the range causing no plating solution instability (producing no undesired precipitates) allows the trivalent chromium conversion solution to provide PWB copper foil that is excellent in controlling Zn and chromate film amount (film thickness). The most optimal trivalent chromium ion concentration range and pH (or control range) of the trivalent chromium conversion solution are 150-300 mg/L and 3.8 (3.6-3.8) respectively, to substantially improve the control of Zn and chromate film amount (film thickness). From the point of view of environment protection and low cost, it is desirable to use the solution which contains no fluoride ions.

This trivalent chromium ions may be that obtained from any of chromium nitrate (e.g., chromium (III) nitrate nonahydrate: $Cr(NO_3)_3 \cdot 9H_2O$, product No. 037-03173, made by Wako Pure Chemical Industries, Ltd.), chromium sulfate (e.g., chromium (III) sulfate n-hydrate: $Cr_2(SO_4)_3 \cdot nH_2O$, product No. 039-13182, made by Wako Pure Chemical Industries, Ltd.), or chromium chloride (e.g., chromium (III) chloride hexahydrate: $CrCl_3 \cdot 6H_2O$, product No. 033-03131, made by Wako Pure Chemical Industries, Ltd.). It is desirable that lowering the pH (increasing the acidity) of the trivalent chromium conversion solution be performed using a nitric acid solution. It is desirable, on the other hand, that raising the pH (decreasing the acidity) thereof be performed using a sodium hydroxide solution. The chemical conversion is performed by immersing copper foil in the treatment solution. It is desirable that the treatment temperature is on the order of room temperature (15-40° C.). Also, the treatment time is not particularly limited, but is desirably adjusted to the order of 1-20 sec from the point of view of manufacturing line speed.

In the case of trivalent chromium conversion of the zinc plating layer, it is desirable that the deposited chromium amount is 0.5 $\mu g/cm^2$ or more to 2.5 $\mu g/cm^2$ or less, more preferably 0.5 $\mu g/cm^2$ or more to 2.0 $\mu g/cm^2$ or less, still more preferably 0.7 $\mu g/cm^2$ or more to 1.5 $\mu g/cm^2$ or less. Less than 0.5 $\mu g/cm^2$ of deposited chromium amount causes a loss of rust resistance such as resistance to oxidative and damp discoloration. On the other hand, more than 2.5 $\mu g/cm^2$ of the deposited chromium makes the chromium layer itself thick and fragile, thus leading to a decrease in the peeling strength as copper foil.

Silane Coupling

The above-described treatment of the bonded side of the copper foil to the PWB base material is followed by silane coupling to enhance the peeling strength. Because of commercial silane coupling agents of various kinds having their respective features, it is necessary to select one suitable for a PWB base material to be bonded. Particularly, effective in using polyimide as the PWB base material, is aminosilane, desirably aminopropyltrimethoxysilane.

The silane coupling is performed by immersing copper foil in the silane coupling agent solution. In this treatment, it is mainly considered that silanols in the solution are adsorbed and hydrogen-bonded to OH groups present on the trivalent chromium conversion film or on the underlying metal surface on the copper foil.

The silane coupling is immediately followed by drying. In this case, dehydration occurs from the hydrogen-bonded silanols and hydrogen-bonded portion present on the trivalent chromium conversion film, to provide heat (heat energy) necessary to cause covalent bonding in the hydrogen-bonded portion. This is because the bonding energy of the hydrogen bond is low so that no effect of the silane coupling is obtained. On the other hand, excessive heating is not favorable because it causes pyrolysis of the bonded silanols to form a fragile interface that adversely affects the bonding to the PWB base material.

The drying temperature and drying time, dependent on apparatus structure and processing rate (work time) in the manufacturing process, are 150-300° C. and 15-35 sec respectively in the optimal range. For example, for the apparatus structure that allows ensuring 30 sec drying time, the proper temperature is 150-200° C.

Advantages of the Embodiment (1) Where an insoluble anode is used, it is possible to apply continuously stable nickel plating to PWB copper foil with the simple plating apparatus.
(2) It is possible to provide the nickel plating method that allows reducing the load on human body and environment.
(3) It is possible to provide the PWB copper foil with good adherence (high peeling strength) to PWB base material, and with the uniform stable film formed thereover.

The present invention is explained by way of examples below, but is not limited thereto.

EXAMPLE 1

Electrolytic degreasing is performed by cathode electrolysis, to 16.3 μm thick rolled copper foil, in a solution containing 40 g/L of sodium hydroxide (e.g., sodium hydroxide: NaOH, product No. 194-02135, made by Wako Pure Chemical Industries, Ltd.) and 20 g/L of sodium carbonate (e.g., sodium carbonate: $Na_2CO_3$, product No. 43350-1250, made by JUNSEI CHEMICAL Co. Ltd.), at temperature of 40° C., current density of 5 $A/dm^2$; and for treatment time of 10 sec. This is followed by immersion in 50 g/L of sulfuric acid (e.g., sulfuric acid: $H_2SO_4$, product No. 83010-0330, made by JUNSEI CHEMICAL Co. Ltd.) at temperature of 40° C. and for treatment time of 10 sec for acid cleaning.

The Hull cell plating (plating with the spacing between the cathode (member to be plated) and anode, inclined (continuously varied)) is performed to the above copper foil in the nickel plating solution composition and treatment conditions shown in Table 1. The plating apparatus uses a Hull cell water tank made by YAMAMOTO-MS Co. LTD. The current condition is 3A×5 min. Examples 1-1 and 1-2 and comparison example 1-3 use an insoluble platinum-plated titanium anode plate, and comparison examples 1-1 and 1-2 use a nickel anode plate.

Figure 3:
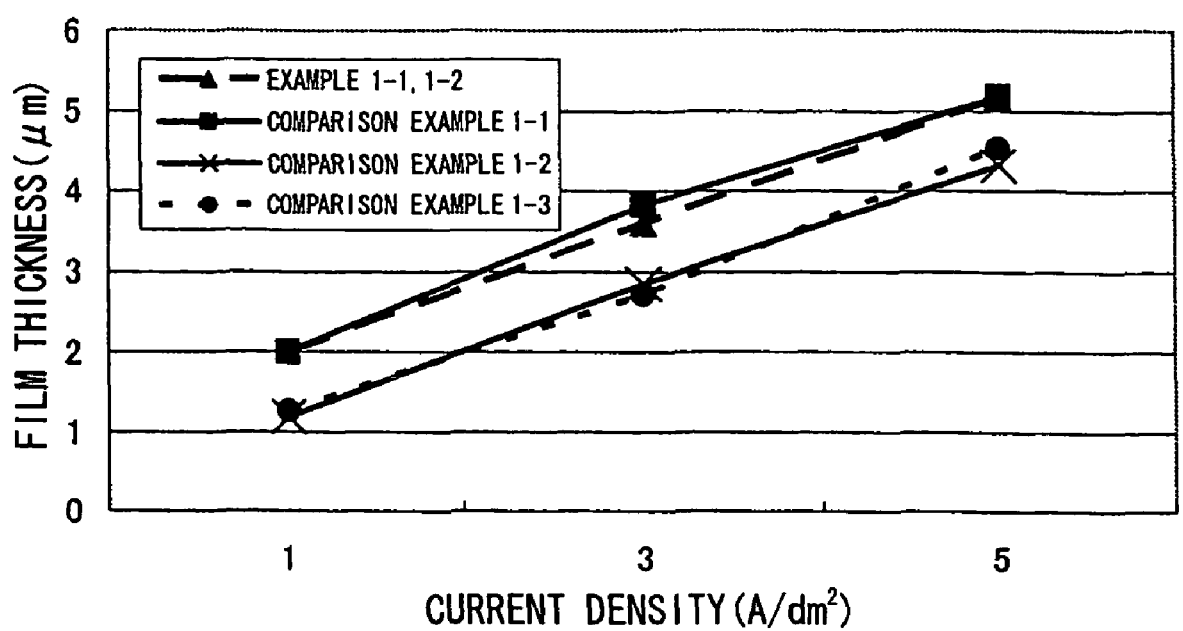
FIG. 3 is a diagram showing "the relationship between current density and film thickness" in Example 1.

With respect to positions corresponding to 1 $A/dm^2$, 3 $A/dm^2$, and 5 $A/dm^2$ current densities respectively, film thickness is measured using an electrolytic film thickness meter (CT-2 made by Densoku Instruments Co. Ltd.). The electrolytic film thickness meter is a film thickness measuring instrument that uses an electrolytic solution for constant current anode electrolysis to dissolve plating film constant area, to take anode potential change time length as time length taken in dissolving the plating film. FIG. 3 shows the relationship between the current density and the film thickness. Also, the terms "Good" and "Poor" in Table 1 denote results of evaluating films formed: 95% or more and less than 95%, respectively, film thickness measured by the electrolytic film thickness meter, relative to theoretical precipitation amount.

TABLE 1

Relationship between nickel plating solution composition/ treatment conditions, and film formation property

| | Solution composition Treatment conditions | Anode kind | Film formation property |
|---|---|---|---|
| Example 1-1 | Nickel sulfate[*1]: 150 g/L<br>Sodium citrate[*2]: 20 g/L<br>Solution temperature: 30° C.<br>pH 3 | Insoluble anode | Good |
| Example 1-2 | Nickel sulfate[*1]: 190 g/L<br>Citric acid[*3]: 15 g/L<br>Solution temperature: 30° C.<br>pH 3 | Insoluble anode | Good |
| Comparison example 1-1 | Nickel sulfate[*1]: 300 g/L<br>Nickel chloride[*4]: 45 g/L<br>Boric acid[*5]: 50 g/L<br>Solution temperature: 30° C.<br>pH 3 | Nickel plate | Good |
| Comparison example 1-2 | Nickel sulfate[*1]: 300 g/L<br>Boric acid[*5]: 50 g/L<br>Solution temperature: 30° C.<br>pH 3 | Nickel plate | Poor |
| Comparison example 1-3 | Nickel sulfate[*1]: 150 g/L<br>Boric acid[*5]: 50 g/L<br>Solution temperature: 30° C.<br>pH 3 | Insoluble anode | Poor |

Comparison example 1-1 uses general Watt bath conditions. From Table 1 and FIG. 3, it is found that Examples 1-1 and 1-2 exhibit the film formation property equal to the Watt bath (Comparison example 1-1) with substantially 100% precipitating efficiency, and exhibit a better film thickness proportionality degree (in other words, film thickness controllability) with respect to the current density than Comparison example 1-1. That is, Examples 1-1 and 1-2 exhibit the film formation/control properties equal to or higher than the general Watt bath, and have the advantage of allowing plating to be applied with little variation with time, continuously and stably by the insoluble anode of the present invention. On the other hand, comparison examples 1-2 and 1-3 are poor in the film formation, film thickness controllability and current flow efficiency, compared to Examples 1-1 and 1-2.

EXAMPLE 2

Similarly to Example 1, electrolytic degreasing and acid cleaning are performed using 16.3 μm thick rolled copper foil. As shown in Table 2, varying cobalt concentration in a plating solution, and using an insoluble platinum alloy anode plate, nickel-cobalt alloy plating is applied to this copper foil, to obtain copper foil with nickel-cobalt alloy plating of Examples 2-1 and 2-2, and comparison examples 2-1 and 2-2 applied thereto. The conditions other than the cobalt concentration are as follows: 140 g/L of nickel sulfate (nickel (II) sulfate hexahydrate: $NiSO_4.6H_2O$, product No. 148-01175, made by Wako Pure Chemical Industries, Ltd.); 20 g/L of sodium citrate (trisodium citrate dihydrate: $Na_3(C_6H_5O_7).2H_2O$, product No. 26075-1201 made by JUNSEI CHEMICAL Co. Ltd.); 30° C. of solution temperature; pH of 3; 0.5-5 $A/dm^2$ of current density; and 10 sec of treatment time.

The precipitation ratio of nickel (Ni) and cobalt (Co) of the plating films obtained is measured with a scanning electron microscopy-energy dispersion X-ray analyzer (SEM-EDX, S-4300 made by Hitachi, Ltd., EMAX-300 by Horiba, Ltd., Acceleration voltage: 15 kV, Analyzed surface area: approx. 70×100 $μm^2$). The results of measuring the cobalt precipitation ratio are shown in Table 2, and also in FIG. 4 as the relationship between the current density and the cobalt precipitation ratio.

TABLE 2

Relationship between cobalt concentration in the plating solution and cobalt precipitation ratio in the film

| | Co concentration in plating solution Co/(Ni + Co) | Co precipitation ratio (mass %) | | | |
|---|---|---|---|---|---|
| | | 0.5 A/dm² | 1 A/dm² | 3 A/dm² | 5 A/dm² |
| Example 2-1 | 0.20 | 89 | 84 | 72 | 60 |
| Example 2-2 | 0.12 | 72 | 65 | 56 | 45 |
| Comparison example 2-1 | 0.10 | 69 | 59 | 40 | 27 |
| Comparison example 2-2 | 0.30 | 90 | 88 | 75 | 62 |

Figure 4:
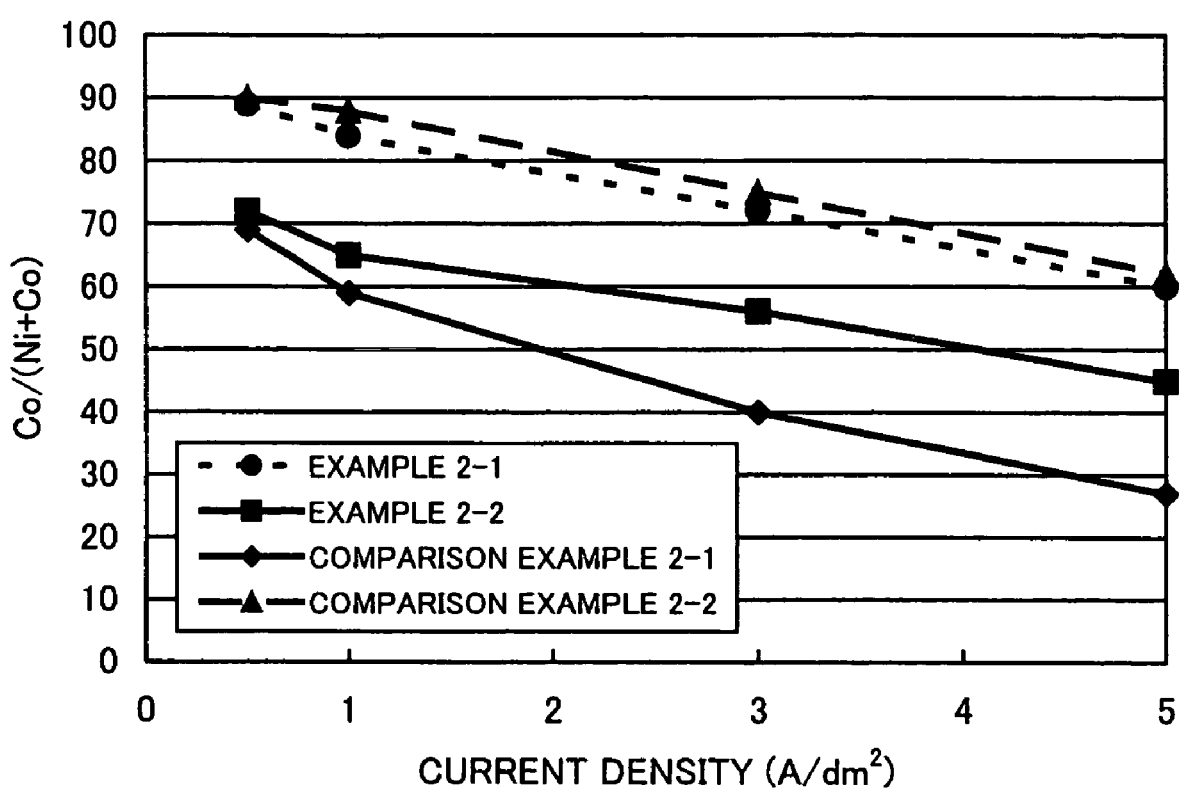
FIG. 4 is a diagram showing "the relationship between current density and Co precipitation ratio" in Example 2.

From Table 2 and FIG. 4, it is found that Examples 2-1 and 2-2, and comparison examples 2-1 and 2-2 all exhibit that the cobalt precipitation ratio decreases with increasing the current density. Here, in the case of 3-5 A/dm² of the current density, for example, Example 2-1 sufficiently satisfies 60 mass % or more to 80 mass % or less cobalt precipitation ratio desirable for adhesion to PWB base material. Also, in the case of 1-3 A/dm² of the current density, Example 2-2 satisfies 55 mass % or more to 65 mass % or less cobalt precipitation ratio that allows a decrease in the "erosion phenomenon" in the manufacturing process after circuit wiring formation. On the other hand, comparison example 2-1 satisfies 60 mass % or more cobalt precipitation ratio at the very low current density only, but requires a very long plating time at this current density and is therefore not practical. Also, despite that comparison example 2-2 has the higher cobalt concentration in the plating solution than Example 2-1, the cobalt precipitation ratio of comparison example 2-2 is substantially equal to that of Example 2-1. This means an increase in surplus chemical amount that does not contribute to the plating (precipitation), which shows no need to use expensive cobalt raw material more than requires.

Figure 5:
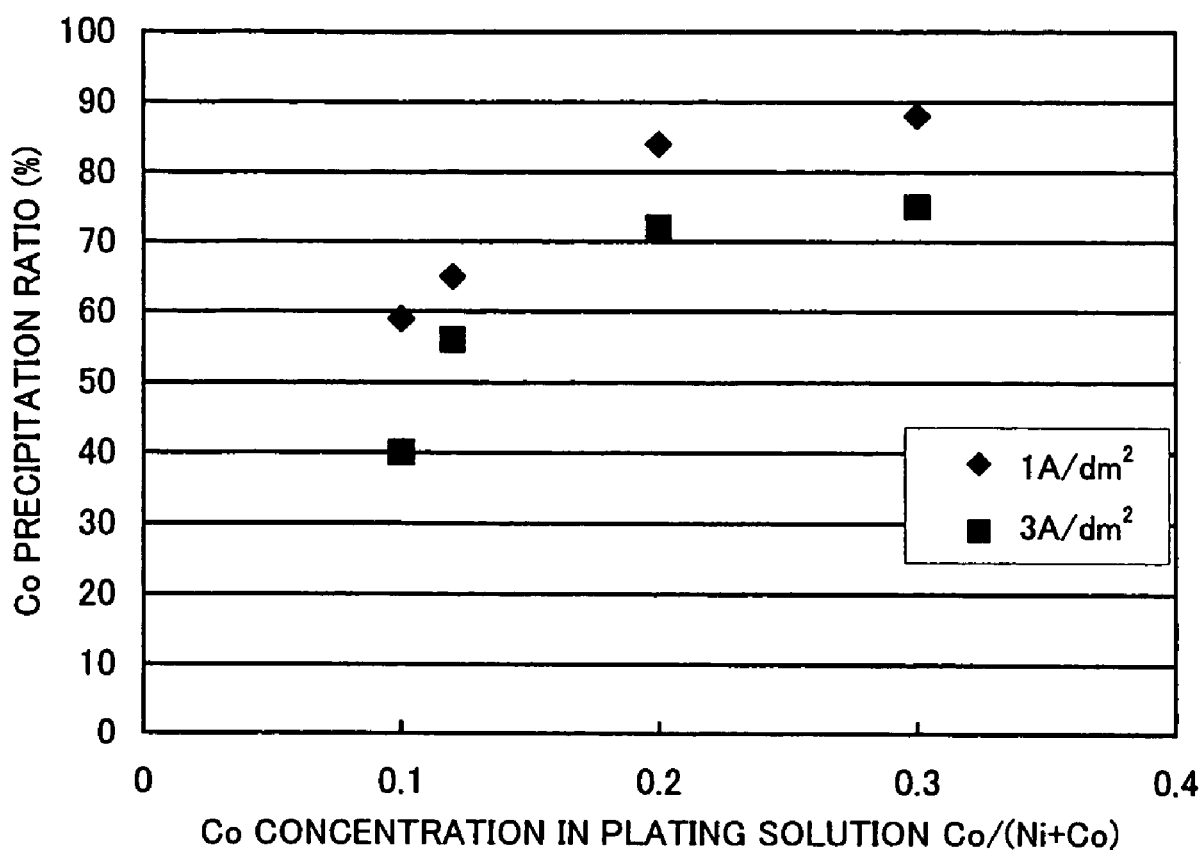
FIG. 5 is a diagram showing "the relationship between Co/(Ni+Co) in a nickel plating solution and Co precipitation ratio" in Example 2.

FIG. 5 shows the relationship between the Co precipitation ratio and the cobalt concentration in the plating solution, Co (mass)/(Ni+Co) (mass), when nickel-cobalt alloy plating is applied at 1 A/dm² and 3 A/dm² of current densities. As mentioned above, it is seen how the Co precipitation ratio is saturated with increasing cobalt concentration in the plating solution. From the results (Table 2, FIGS. 4 and 5) above, it is found that the cobalt concentration in the plating solution satisfies preferably 0.11≦[cobalt (mass)/(nickel+cobalt) (mass)]≦0.25.

EXAMPLE 3

Similarly to Example 1, using 16.3 μm thick rolled copper foil, electrolytic degreasing and acid cleaning are performed, followed by roughening this copper foil. The roughening conditions are to use a plating bath added with 30 g/L of copper sulfate (copper (II) sulfatepentahydrate: $CuSO_4 \cdot 5H_2O$, product No. 83435-1201, made by JUNSEI CHEMICAL Co. Ltd.), 130 g/L of sulfuric acid (sulfuric acid: $H_2SO_4$, product No. 83010-0330, made by JUNSEI CHEMICAL Co. Ltd.), 5 g/L of iron sulfate (iron (II) sulfate heptahydrate: $FeSO_4 \cdot 7H_2O$, product No. 83380-1201 made by JUNSEI CHEMICAL Co. Ltd.), 0.5 g/L of sodium molybdate (disodium molybdate (VI) dihydrate: $Na_2MoO_4 \cdot 2H_2O$, product No. 77080-1201 made by JUNSEI CHEMICAL Co. Ltd.), 0.033 g/L of titanium sulfate (30% titanium (IV) sulfate solution: $Ti(SO_4)_2$, product No. 206-13835 made by JUNSEI CHEMICAL Co. Ltd.), and 0.1 ppm of gelatin (gelatin, product No. 077-03155, made by Wako Pure Chemical Industries, Ltd.); 40° C. of solution temperature; 40 A/dm² of current density in dendritic copper electrodeposition layer formation; and 3 sec of treatment time. This is followed by application of nickel-cobalt alloy plating with the plating solution compositions shown in Table 3. The anode uses an insoluble titanium plate with an iridium oxide deposited thereon, or a nickel plate. The electrolytic condition is 1 A/dm²×10 sec. Subsequently, a specified amount of zinc plating is electrodeposited such that the deposition amount of zinc after chemical conversion is 1.0 μg/cm², followed by trivalent chromium conversion and silane coupling treatment. The chromium deposition amount is 1.1 μg/cm².

To evaluate the peeling (adhering) strength between a polyimide film (base material, resin) and the copper foil, the peeling strength of the laminates of the copper foil and the polyimide film is measured in compliance with JIS C6481. The evaluation of the peeling strength is denoted by "Good" for 0.7 N/mm or more, "Fair" for 0.5 N/mm or more to less than 0.7 N/mm, and "Poor" for less than 0.5 N/mm. The results are shown in Table 3.

Also, with respect to samples made in the same way, the peeling strength after 150° C.×168 h heating in atmosphere is measured for heat resistance evaluation. The evaluation is performed with retention from peeling strength prior to heating (=[peeling strength after heating/peeling strength before heating]×100 (%)), and is denoted by "Good" for 90% or more retention, "Fair" for 75% or more to less than 90%, and "Poor" for less than 75%. The results are shown together in Table 3.

The chemicals used in Tables 1 and 3 are listed in Table 4.

TABLE 3

Relationship between plating solution composition/anode kind, and peeling strength

| | Solution composition Anode kind used | Peeling strength | Peeling strength after 150° C. × 168 h heating | Anode state after 500 h electrical conducting |
|---|---|---|---|---|
| Examples 3-1 & 4-1 | Nickel sulfate(*1): 150 g/L Cobalt sulfate(*6): 40 g/L Sodium citrate(*2): 20 g/L pH 3 Insoluble anode | Good | Good | Good |

TABLE 3-continued

Relationship between plating solution composition/anode kind, and peeling strength

|  | Solution composition Anode kind used | Peeling strength | Peeling strength after 150° C. × 168 h heating | Anode state after 500 h electrical conducting |
|---|---|---|---|---|
| Examples 3-2 & 4-2 | Nickel sulfate(*1): 150 g/L<br>Cobalt sulfate(*6): 40 g/L<br>Citric acid(*3): 10 g/L<br>pH 3<br>Insoluble anode | Good | Good | Good |
| Comparison examples 3-1 & 4-1 | Nickel sulfate(*1): 300 g/L<br>Nickel chloride(*4): 45 g/L<br>Cobalt sulfate(*6): 80 g/L<br>Boric acid(*5): 50 g/L<br>pH 3<br>Nickel plate anode | Good | Good | Poor |
| Comparison examples 3-2 & 4-2 | Nickel sulfate(*1): 300 g/L<br>Nickel chloride(*4): 45 g/L<br>Cobalt sulfate(*6): 40 g/L<br>Boric acid(*5): 50 g/L<br>pH 3<br>Nickel plate anode | Fair | Poor | Poor |
| Comparison examples 3-3 & 4-3 | Nickel sulfate(*1): 150 g/L<br>Cobalt sulfate(*6): 20 g/L<br>Sodium citrate(*2): 20 g/L<br>pH 3<br>Insoluble anode | Fair | Poor | Good |
| Comparison examples 3-4 & 4-4 | Nickel sulfate(*1): 300 g/L<br>Cobalt sulfate(*6): 80 g/L<br>Boric acid(*5): 50 g/L<br>pH 3<br>Nickel plate anode | Fair | Fair | Fair |

TABLE 4

List of chemicals used in examples and comparison examples (Tables 1 and 3)

| Name | Maker | Product No | Product name | Molecular formula |
|---|---|---|---|---|
| Nickel sulfate(*1) | Wako Pure Chemical Industries, Ltd. | 148-01175 | Nickel (II) sulfate hexahydrate | $NiSO_4 \cdot 6H_2O$ |
| Sodium citrate(*2) | Junsei Chemical Co. Ltd. | 26075-1201 | Trisodium citrate dihydrate | $Na_3(C_6H_5O_7) \cdot 2H_2O$ |
| Citric acid(*3) | Junsei Chemical Co. Ltd. | 26040-1201 | Citric acid monohydrate | $C_6H_8O_7 \cdot H_2O$ |
| Nickel chloride(*4) | Wako Pure Chemical Industries, Ltd. | 148-01055 | Nickel (II) chloride hexahydrate | $NiCl_2 \cdot 6H_2O$ |
| Boric acid(*5) | Wako Pure Chemical Industries, Ltd. | 021-02195 | Boric acid | $H_3BO_3$ |
| Cobalt sulfate(*6) | Junsei Chemical Co. Ltd. | 83240-0401 | Cobalt (II) sulfate heptahydrate | $CoSO_4 \cdot 7H_2O$ |

Comparison example 3-1 uses conventional general nickel-cobalt alloy plating based on a Watt bath. From Table 3, it is found that Examples 3-1 and 3-2 exhibit the peeling strength and heat resistance equal to Comparison example 3-1. On the other hand, comparison examples 3-2 and 3-3 with the low Co concentrations in the plating solution are poor in peeling strength and heat resistance regardless of anode kinds. Also, comparison example 3-4, which has high nickel and cobalt concentration in the plating solution and uses boric acid as a pH buffer, is unstable in peeling strength dependent on measuring location, and exhibits the low results overall.

EXAMPLE 4

To evaluate the durability of the anode, using the same plating solution composition (Table 3) and electrolytic conditions as in previous example 3, 500 h electrical conduction testing is performed. The anode used is an insoluble titanium alloy plate or a nickel plate. After 500 h of electrical conduction, the anode is taken out from a plating tank, to observe its shape change in comparison with its shape before the electrical conduction. The results are shown together in Table 3, and denoted by "Good" for no change, "Fair" for a slight decrease in thickness or irregularities in surface seen, and "Poor" for entire dissolution or marked irregularities in surface seen which are readily lost.

Examples 4-1 and 4-2 and comparison example 4-3 cause no change in anode shape because of insoluble anode use. Comparison examples 4-1 and 4-2 using nickel cause the anode severe dissolution and partial loss. Comparison example 4-4, which contains no chloride ions facilitating anode dissolution but which uses nickel, likewise causes the anode slight dissolution and irregularities in surface seen.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A printed wiring board copper foil, comprising:
   a nickel plating layer comprising a nickel-cobalt alloy plating layer, a total deposit amount of nickel and cobalt on a side to be bonded to a printed wiring board base material being 5 $\mu g/cm^2$ or more to 20 $\mu g/cm^2$ or less, a cobalt concentration being 60 mass % or more to 80 mass % or less,
   wherein said nickel plating layer is applied to said copper foil by using an insoluble anode and a nickel plating solution comprising water, 100 g/L or more and less than 200 g/L of nickel sulfate, and 10 g/L or more and less than 30 g/L of sodium citrate or 8 g/L or more and less than 25 g/L of citric acid dissolved in the water, but no nickel chloride and boric acid added therein, wherein a pH of the solution is adjusted to 2 or more and less than 4.

2. The printed wiring board copper foil according to claim 1, comprising: a rolled copper foil used as an original foil.

3. A printed wiring board copper foil, comprising:
   a nickel plating layer comprising a nickel-cobalt alloy plating layer,
   a total deposit amount of nickel and cobalt on a side to be bonded to a printed wiring board base material being 5 $\mu g/cm^2$ or more to 20 $\mu g/cm^2$ or less, a cobalt concentration being 55 mass % or more to 65 mass % or less,
   wherein said nickel plating layer is applied to said copper foil by a nickel plating method comprising using an insoluble anode and a nickel plating solution comprising water, 100 g/L or more and less than 200 g/L of nickel sulfate, and 10 g/L or more and less than 30 g/L of sodium citrate or 8 g/L or more and less than 25 g/L of citric acid dissolved in the water, but no nickel chloride and boric acid added therein, wherein a pH of the solution is adjusted to 2 or more and less than 4.

* * * * *